United States Patent [19]

Mages et al.

[11] Patent Number: 6,071,059

[45] Date of Patent: *Jun. 6, 2000

[54] LOADING AND UNLOADING STATION FOR SEMICONDUCTOR PROCESSING INSTALLATIONS

[75] Inventors: Andreas Mages; Werner Scheler, both of Jena; Herbert Blaschitz, Munich; Alfred Schulz; Heinz Schneider, both of Jena, all of Germany

[73] Assignee: Brooks Automation GmbH, Jena, Germany

[*] Notice: This patent is subject to a terminal disclaimer.

[21] Appl. No.: 09/003,025

[22] Filed: Jan. 5, 1998

Related U.S. Application Data

[63] Continuation of application No. 08/615,386, Mar. 14, 1996, Pat. No. 5,772,386.

[30] Foreign Application Priority Data

Mar. 28, 1995 [DE] Germany .............................. 195 11 024
Nov. 15, 1995 [DE] Germany .............................. 195 42 646

[51] Int. Cl.$^7$ .................................................. B65G 49/07
[52] U.S. Cl. ........................ 414/411; 414/217; 414/416; 414/937; 414/939; 414/940; 414/331
[58] Field of Search ................................... 414/217, 331, 414/411, 416, 937, 939, 940

[56] References Cited

U.S. PATENT DOCUMENTS

| | | | |
|---|---|---|---|
| 4,674,939 | 6/1987 | Maney et al. ....................... | 414/411 X |
| 4,758,127 | 7/1988 | Imai et al. ............................ | 414/411 |
| 4,897,963 | 2/1990 | Reboul et al. ..................... | 414/411 X |
| 4,995,430 | 2/1991 | Bonora et al. .......................... | 141/98 |
| 5,139,459 | 8/1992 | Takahashi et al. .................. | 414/217 X |
| 5,291,923 | 3/1994 | Gallagher et al. .................. | 414/217 X |
| 5,364,219 | 11/1994 | Takahashi et al. ................... | 414/939 X |
| 5,431,600 | 7/1995 | Murata et al. ....................... | 414/940 X |
| 5,509,772 | 4/1996 | Doche ................................. | 414/940 X |
| 5,562,383 | 10/1996 | Iwai et al. ............................ | 414/940 X |
| 5,607,276 | 3/1997 | Muka et al. ......................... | 414/940 X |
| 5,772,386 | 6/1998 | Mages et al. .......................... | 414/411 |

FOREIGN PATENT DOCUMENTS

| | | |
|---|---|---|
| 0452939 | 10/1991 | European Pat. Off. . |
| 0574893 | 12/1993 | European Pat. Off. ............... 414/217 |
| 2696429 | 4/1994 | France . |
| 1291442 | 11/1989 | Japan . |
| 269955 | 3/1990 | Japan . |
| 3261161 | 11/1991 | Japan . |
| 479347 | 3/1992 | Japan . |
| 485813 | 3/1992 | Japan . |
| 4206547 | 7/1992 | Japan ..................................... 414/940 |
| 4302454 | 10/1992 | Japan . |
| 4-360545 | 12/1992 | Japan . |
| 5-338728 | 12/1993 | Japan . |
| 6-211311 | 8/1994 | Japan . |

OTHER PUBLICATIONS

Patent Abstracts of Japan, Publication No. 06037175A, published Oct. 2, 1994, 1 page.
Patent Abstracts of Japan, Publication No. 01145906A, published Jul. 8, 1989, 1 pag.

Primary Examiner—Douglas Hess
Attorney, Agent, or Firm—Perman & Green, LLP

[57] ABSTRACT

In a loading and unloading station for semiconductor processing installations, the object of the present invention is to ensure charging proceeding from transporting containers under clean room conditions. These transporting containers themselves serve as magazines for disk-shaped objects and are open laterally. It should also be possible, optionally, to load and unload a greater quantity of such transporting containers, wherein the exchange of transporting containers must be effected under favorable ergonomic conditions. According to the invention, the transporting container for loading, unloading and reloading of disk-shaped objects is coupled in a stationary manner by the container cover with the closure by using of an adhering engagement. The charging opening and the transporting container are opened simultaneously in that the container cover and the closure are moved down jointly into the semiconductor processing installation. The loading and unloading is carried out in that a manipulating device which is arranged in the semiconductor processing installation engages through the charging opening into the transporting container. The invention is applicable in the manufacturing of integrated circuits.

2 Claims, 10 Drawing Sheets

LOADING AND UNLOADING STATION FOR SEMICONDUCTOR PROCESSING INSTALLATIONS

This is a continuation of U.S. patent application Ser. No. 08/615,386, filed Mar. 14, 1996, now U.S. Pat. No. 5,772,386.

BACKGROUND OF THE INVENTION a) Field of the Invention

The invention is directed to a loading and unloading station for semiconductor processing installations with at least one closeable charging opening through which wafer-shaped or disk-shaped objects which are accommodated in a transporting container can be loaded, unloaded and reloaded after removing a closure, wherein the transporting container is provided with a container cover which extends substantially at right angles to the loading plane.

b) Description of the Related Art

For the purpose of charging semiconductor processing installations, it is known to use so-called SMIF boxes as magazine containers with a relatively small enclosed volume in which wafer magazines can be stored and transported. The box can be placed on an opening mechanism in an enclosure or housing which encloses one or more work stations so as to keep them free of dust. The box and opening mechanism have closing elements which are adapted to one another and which can be opened simultaneously one above the other so that dust particles resting on the outside of the closing elements can be enclosed therebetween when the wafer magazines are lowered into the housing together with the two closing elements. The box itself encloses the opening formed in the housing.

A loading and unloading device according to the German Patent 43 26 309 C1, for example, or a device having another operating sequence serves to remove the magazines from the transporting containers and place them in the processing installation. After the semiconductor wafers are processed, the magazines are transported back in the transporting containers.

The technique of SMIF boxes is especially suited for semiconductor wafers with smaller diameters, as is conventional. In view of the material characteristics of the semiconductor wafers, these SMIF boxes and the wafer magazines used with them are becoming increasingly unsuitable as transporting containers as the diameter of semiconductor wafers increases. Transporting containers which take over the function of magazines at the same time are already known for semiconductor wafers of this type. Loading, unloading and reloading of the semiconductor wafers is effected individually in a plane parallel to the surface of the semiconductor wafers, wherein the transporting container can be closed by a container cover extending substantially at right angles to the loading and unloading plane. Accordingly, in contrast to the SMIF box, the container cover is removed and inserted laterally rather than in a downward direction.

Since the transporting containers are enclosed by a space with low requirements as regards cleanness and since there are no magazines which can be loaded and unloaded such as those used in the SMIF technique, the charging of semiconductor processing installations proceeding from these transporting containers and the transporting back from such installations into the transporting containers presents problems. Moreover, the problem is exacerbated in that optional loading and unloading into and out of a greater number of transporting containers must be ensured under certain circumstances and the containers themselves must be supplied and removed by operating personnel under favorably ergonomic conditions.

An arrangement for storing, transporting and inserting substrates is known from EP 542 793 B 1. In this arrangement, a cassette with a lateral closing cap is arranged opposite a loading slot. The cassettes are brought into the loading position one after the other by a lifting plate which can hold a packet of stacked cassettes. When this position is reached, the closing cap is swiveled open at one edge and the substrate wafer is inserted into the clean room by a drawer which can travel out of the cassette. An air flow exiting from the loading slot prevents particles from penetrating into the clean room in that it passes through an open gap between a protruding seal and the cassette.

OBJECT AND SUMMARY OF TILE INVENTION

The primary object of the present invention is to ensure a charging of semiconductor processing installations proceeding from transporting containers under clean room conditions, these transporting containers themselves serving as magazines for disk-shaped objects and being open laterally. It should also be possible, optionally, to load and unload a greater quantity of such transporting containers, wherein the exchange of transporting containers must be effected under favorable ergonomic conditions.

In a loading and unloading station for semiconductor processing installations with a closable charging opening through which disk-shaped objects, which are accommodated in a transporting container, can be loaded, unloaded and reloaded after removing a closure, wherein the transporting container is provided with a container cover which substantially extends so as to be directed vertically to the loading and unloading plane, the object according to the present invention is met in that the transporting container for loading, unloading and reloading of disk-shaped objects is coupled in a stationary manner by the container cover with the closure by means of an adhering engagement and a simultaneous opening of the charging opening and transporting container is effected in that the container cover and the closure are moved down jointly into the semiconductor processing installation. The loading and unloading is carried out in that a manipulating device which is arranged in the semiconductor processing installation engages through the charging opening into the transporting container.

For the purpose of coupling with the closure, the transporting container is deposited on a horizontally adjustable first platform which is provided with means for aligning and securing the transporting container.

The platform is adjustable between at least two planes which are located one above the other, one of which planes serves for charging with a transporting container at an ergonomic height, while the other serves for loading and unloading the semiconductor processing installation.

In an advantageous manner, a suitable number of additional, horizontally adjustable platforms which are provided with means for aligning and securing the transporting container can be provided for holding at least one additional transporting container. At least one of the platforms serves alternately to couple a transporting container with the closure, while the others remain free for the exchange of transporting containers.

A storage is also advantageously provided for the exchange of transporting containers, in which storage a gripper has optional access to storage compartments or shelves which are arranged one above the other and a loading opening with a transporting container holder is provided for manual charging with transporting containers. A space corresponding to the dimensions of a transporting container is left open adjacent to the storage shelves for transferring the transporting containers between the transporting container holder, storage shelves, and the platform. The transporting container holder should be able to travel out through the loading opening for the purpose of charging.

Further, the closure advantageously has vacuum suction devices for producing the adhering engagement with the container cover and is provided with elements for aligning relative to the container cover which can take effect before the adhering engagement is produced.

In order to open the transporting container, keys for actuating the locking elements in the container cover project out of the closure, matching keyholes for these keys being provided in the container cover, by which the closure and container cover are secured above and beyond the adhering engagement. The aligning elements and the keys can be held in a springing manner vertically to the loading and unloading plane in order to compensate for differences between the approach of the closure and the container cover.

Also, the charging opening is advantageously worked into a plate or shield which is adjustable, relative to the manipulating device, jointly with the coupled transporting container for loading and unloading the disk-shaped objects in a direction vertical to the loading and unloading plane depending on the indexed positions. Accordingly, it is possible to carry out the movement between the different planes as well as the indexing movements by means of an individual elevator.

However, it is also possible to construct the manipulating device for loading and unloading the disk-shaped objects in a direction vertical to the loading and unloading plane depending upon the indexed positions.

By means of the described solution according to the invention, transporting containers of the type described above can be used without negatively affecting the clean room conditions within the semiconductor processing installation to be charged. Semiconductor wafers with dimensions of 300 mm can be manipulated easily. Dust particles located on the container cover during the coupling with the closure are reliably enclosed between the surfaces which are connected in an adhering engagement.

The invention will be explained more fully in the following with reference to the schematic drawings.

DESCRIPTION OF THE PREFERRED EMBODIMENTS

Figure 1:
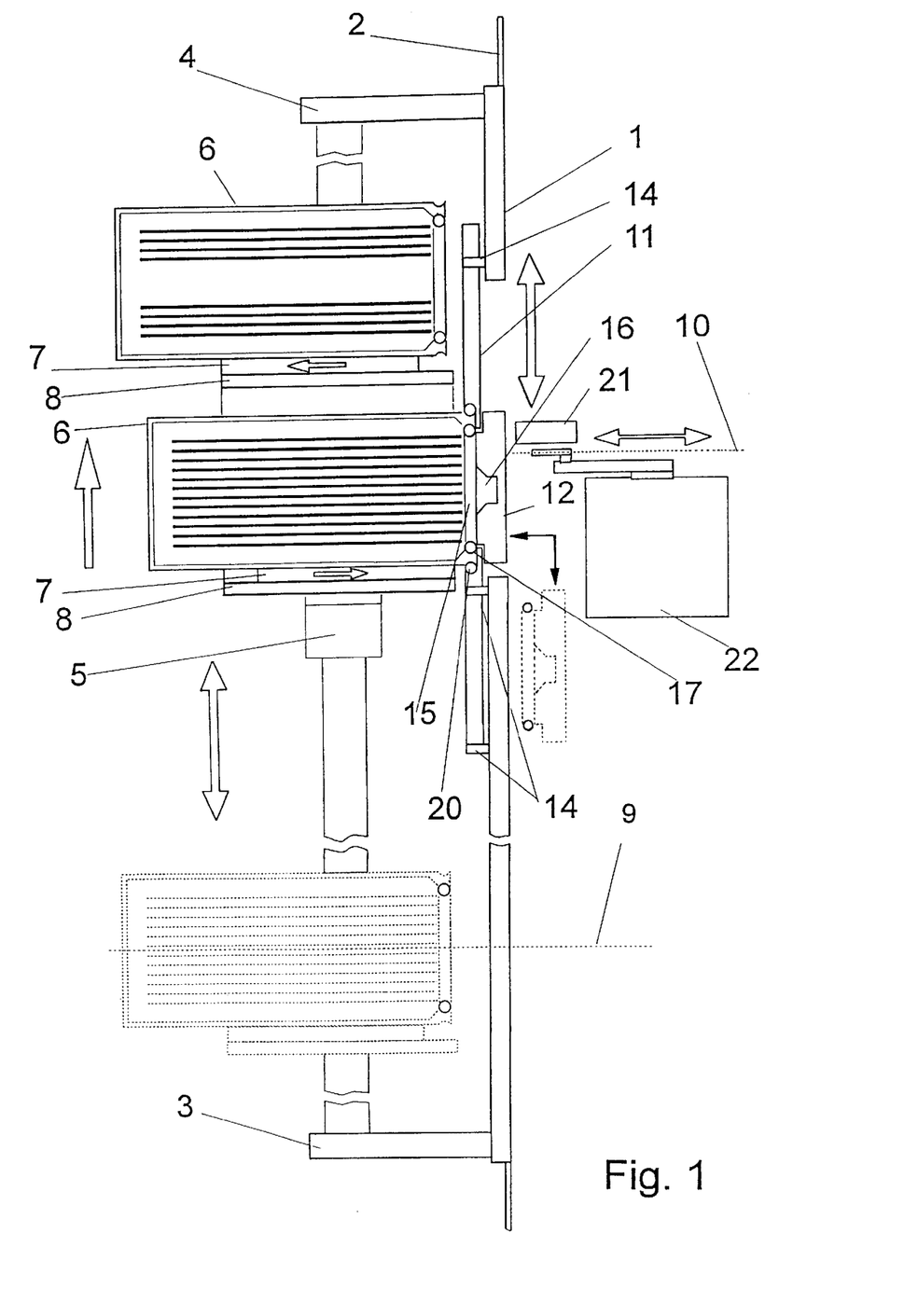
FIG. 1 shows a basic side view of a loading and unloading station with a displaceable shield.
Figure 2:
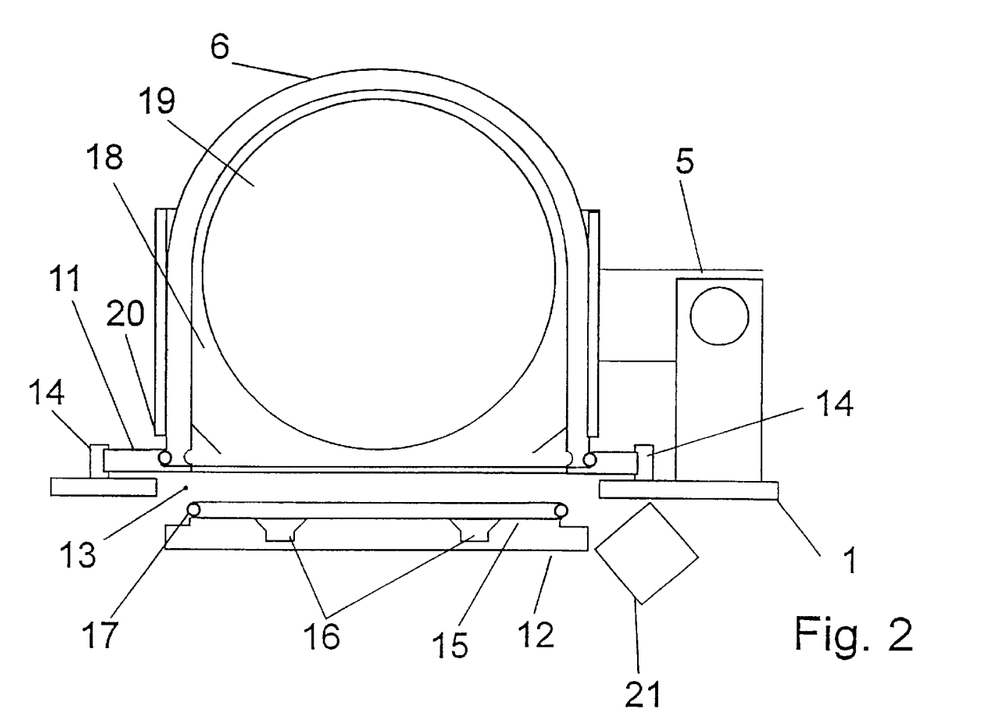
FIG. 2 shows a top view of the loading and unloading station.
Figure 3:
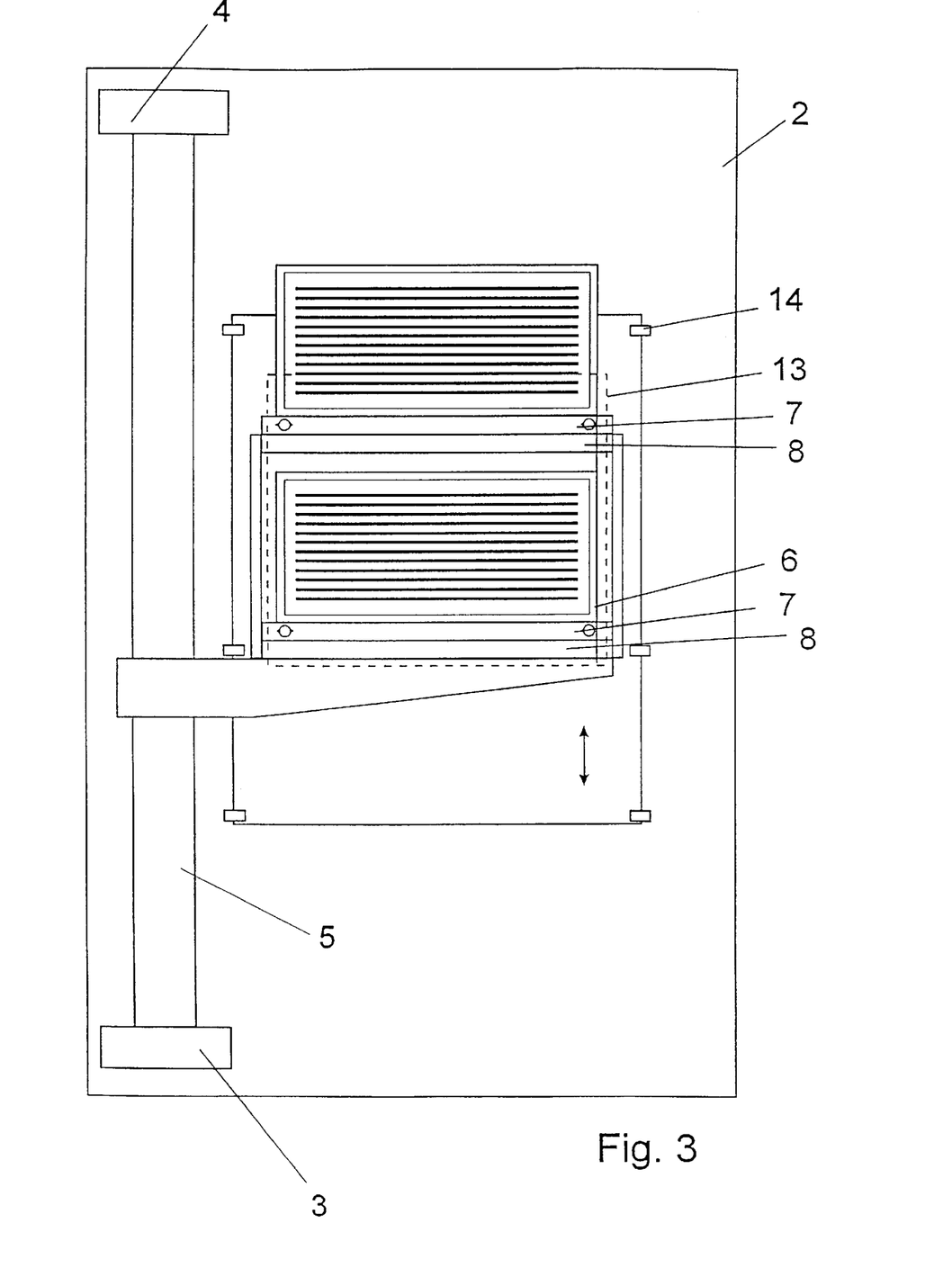
FIG. 3 shows a front view of the loading and unloading station.

In FIGS. 1 to 3, a frame 1 which is connected in a stationary manner with a wall element 2 by two angled frame elements 3, 4 carries an elevator 5.

Platforms 7 which are adjustable horizontally in the direction of the wall element 2 in a guide 8 which is secured at the elevator 5 serve as holding means for transporting containers 6 which can be shaped and outfitted in different ways within certain limits. The platforms 7, whose quantity is not restricted to that shown herein, are movable by means of the elevator 5 between at least two planes 9 and 10 which are situated one above the other. While plane 9 is situated at an ergonomically favorable height for charging the platforms 7, the semiconductor processing installation is loaded and unloaded in plane 10. For this purpose, a charging opening 13 which can be closed by means of a closure 12 is worked into a shield 11. The shield 11 is adjustable in a direction vertical to the plane 10 along the wall 2 so as to be guided by guide means 14 and performs a sealing function relative to the opening in the wall element 2. A transporting container 6 is coupled to the closure 12 by its container cover 15 in an adhering engagement by means of the horizontal displacement of one of the platforms 7 in the direction of the wall element 2. For this purpose, suction elements 16 are incorporated in the closure 12, a hose connection, not shown, leading from the latter to a vacuum source.

The container cover 15 which is slid into and locked in the transporting container 6 is surrounded by a seal 17 ensuring a seal relative to the surrounding wall. Unlocking is effected after the adhering engagement is produced, and the closure 12 can be moved down together with the container cover 15 into the semiconductor processing installation in the manner indicated by an angled arrow.

Every transporting container 6 has shelves for receiving disk-shaped objects 19, which shelves are situated one above the other and are formed by projections 18. In order to load and unload the latter through the charging opening 13 in plane 10, it is necessary in the construction shown in FIG.

1 to adjust the vertical position of the transporting container 6 in a suitable manner. For this purpose, the transporting container 6 is additionally sealed externally relative to the shield 11 by a seal 20, this shield 11 being carried along in turn by a vertical indexing movement which is likewise executed by means of the elevator 5. The clean room conditions within the semiconductor processing installation remain unimpaired as a result of the sealing function of the shield 11.

For the purpose of indexing, an index sensor 21 detects the projections 18 and the disk-shaped objects 19 during the vertical adjustment of the transporting container 6.

Loading and unloading is effected in plane 10 by means of a manipulating device 22 arranged in the clean room region of the semiconductor processing installation by engaging through the charging opening 13.

Figure 4:
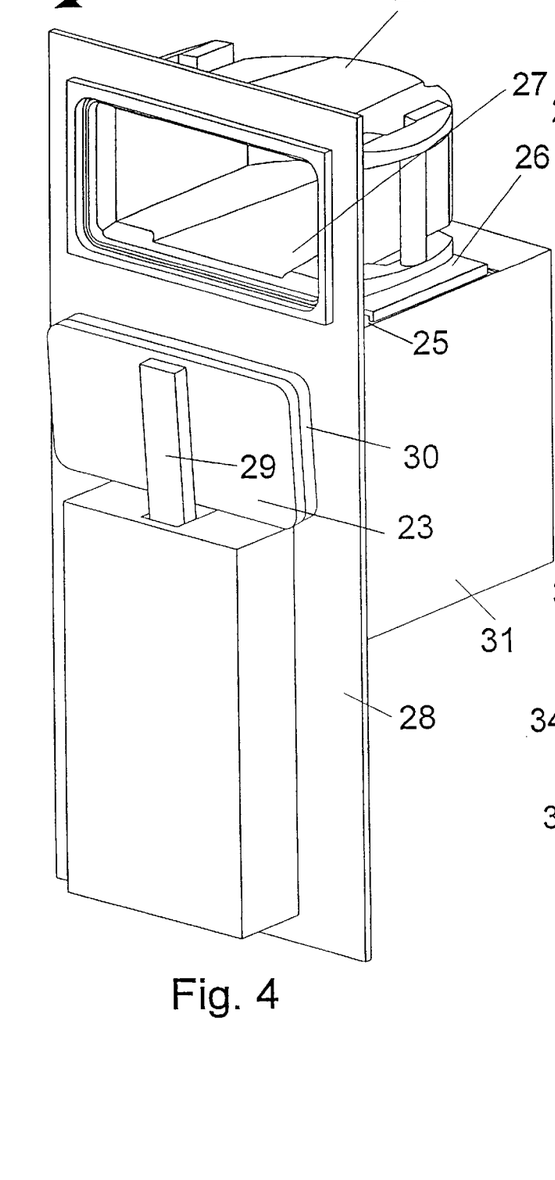
FIG. 4 is a perspective view of a loading and unloading station with a transporting container in the coupled and opened state.
Figure 5:
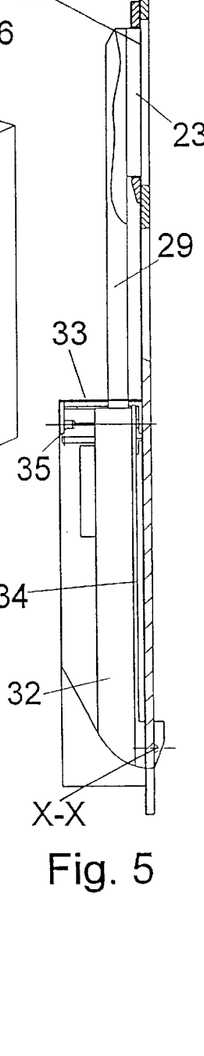
FIG. 5 is a view in partial section of a first device for opening and closing a closure, shown in the closed state.
Figure 6:
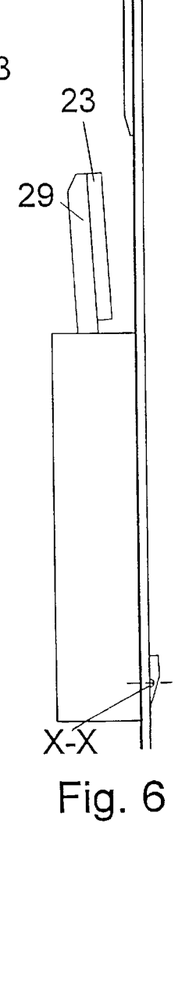
FIG. 6 shows a side view of the device according to FIG. 5 in the closed state.

In the loading and unloading station shown in FIG. 4, a device which is shown in more detail in FIG. 5 is used to open and close a closure 23. A transporting container 24 which is already opened is deposited on a platform 26 which is supported by a stationary plate 25 and is displaceable horizontally in the direction indicated by the arrow, this transporting container 24 communicating with a charging opening 27 in a wall element 28. The closure 23 is secured to an arm 29, which is adjustable vertically and relative to the wall element 28, and supports a container cover 30 which is coupled by means of an adhering engagement. Driving and controlling elements for the loading and unloading station are accommodated in a housing 31.

According to FIG. 5, lifting cylinders 32 and 33 are provided for vertical adjustment and for adjusting the arm 29 relative to the wall element 28, wherein the lifting cylinder 32 which is secured to a support plate 34 is swivelable together with the support plate 34 about an axis X—X until reaching a stop 35 by means of the action of the lifting cylinder 33.

Figures 7, 8:
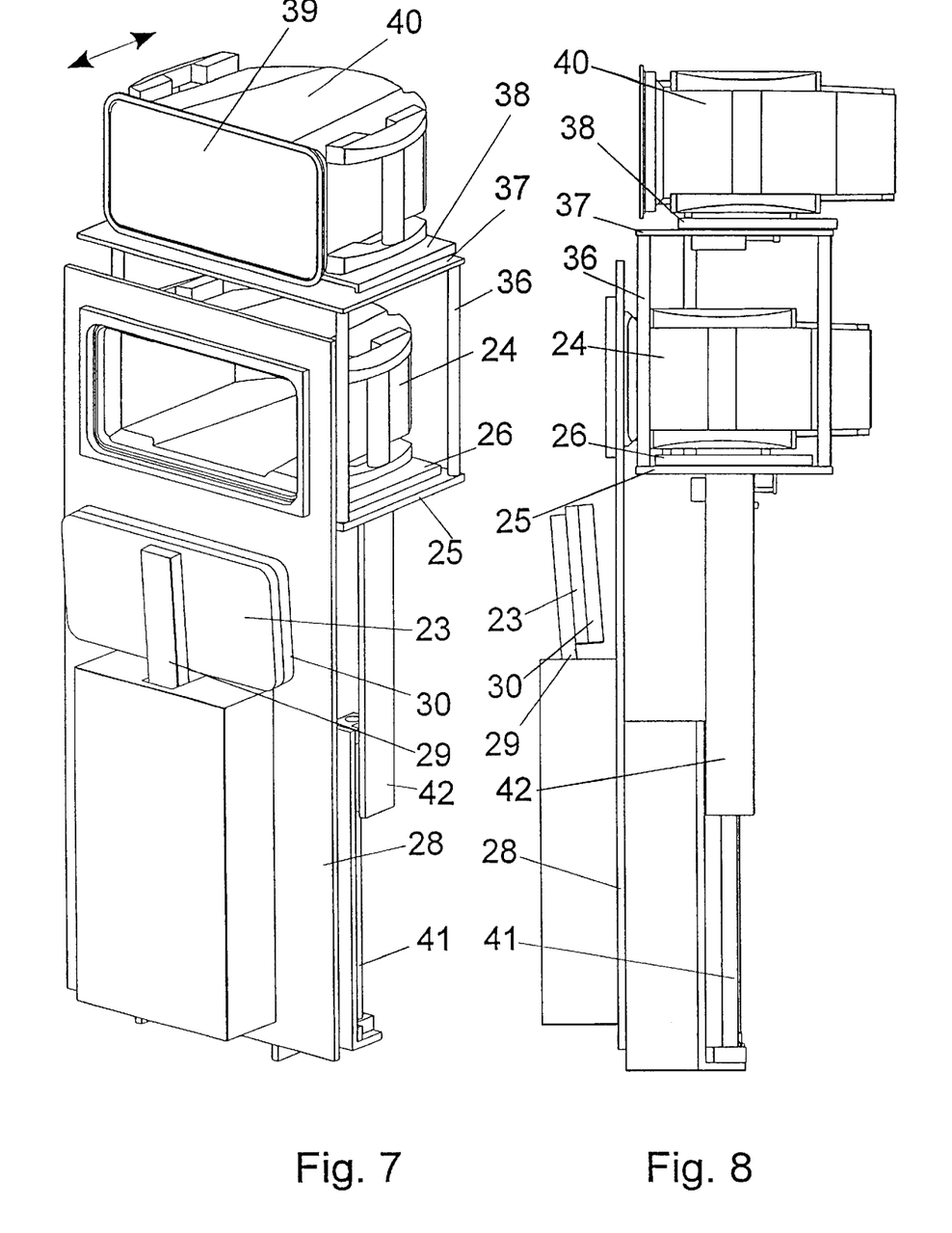
FIG. 7 shows a perspective view of a loading and unloading station with an additional platform and additional transporting container.
FIG. 8 shows a side view of the loading and unloading station according to FIG. 7.

In FIG. 7, in contrast to the embodiment form according to FIG. 4 which provides for holding only one transporting container 24, supports 36 which are secured to the plate 25 carry an additional stationary plate 37 to which is fastened a second platform 38 which is displaceable horizontally in the direction of the arrow. Another transporting container which is closed by a transporting container cover 39 is designated by 40.

The two platforms 26, 37 are adjustable vertically via a supporting arm 42 which is connected with the plate 25 and can be raised and lowered by a drive 41. While one of the platforms 26, 37 serves to couple a transporting container 24 or 38 to the closure 23, the other remains available for the exchange of transporting containers.

Of course, the vertical adjustability shown in FIGS. 7 and 8 is also readily applicable by a person skilled in the art to the construction shown in FIG. 4 in that only one transporting container is adjustable between two planes. Similarly, the quantity of transporting containers which can be held can also be increased in accordance with the respective requirements.

Figure 9:
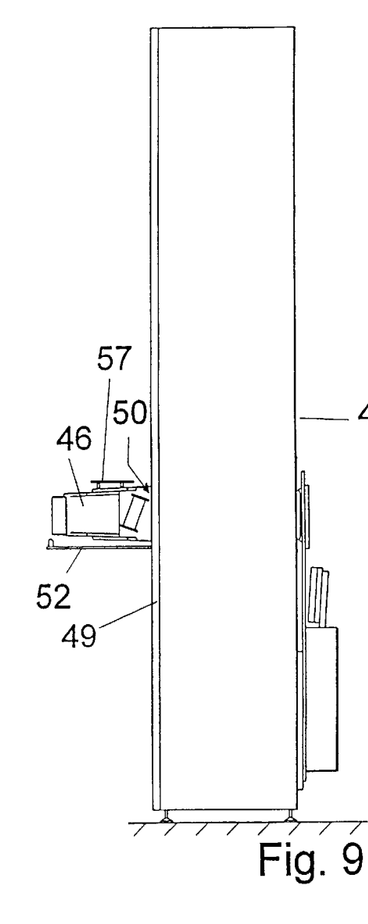
FIG. 9 shows a side view of a storage for transporting containers.
Figure 10:
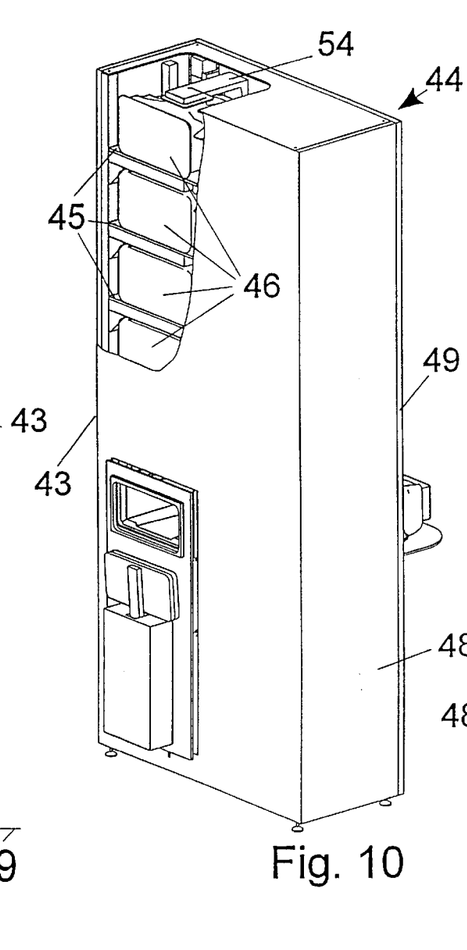
FIG. 10 shows the storage in a perspective view and partially opened.
Figure 11:
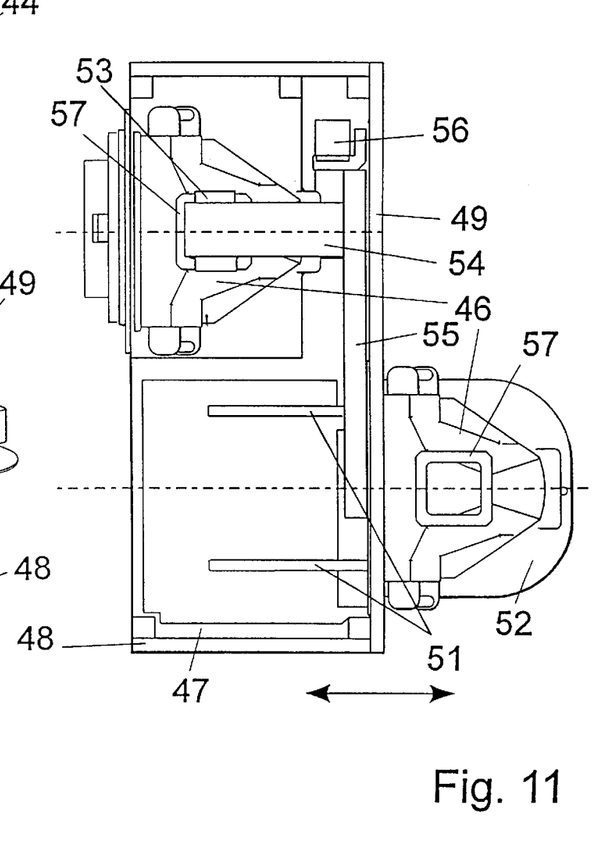
FIG. 11 shows a top view of an opened storage.

A storage can be used for changing transporting containers in loading and unloading devices according to FIGS. 4, 7 and 8 as is described more fully with reference to FIGS. 9 to 11.

The loading and unloading device is integrated in a wall 43 of a housing 44 provided with storage shelves 45 which are arranged one above the other and serve to hold transporting containers 46. In the present embodiment example, the storage is so constructed that the storage shelves 45 are arranged above the platforms of the loading and unloading device regardless of the loading and unloading direction. For the purpose of optional access to the transporting containers 46 in the storage shelves 45, it is essential that a space 47 corresponding to the dimensions of the transporting containers 46 be left open between the storage shelves 45 and a wall of the housing 44 other than wall 43. The wall at which the space is left open is determined by the available space for storage.

In the present construction, the free space is located at a wall 48 adjoining the wall 43 with the loading and unloading device so that a storage of small depth is formed. A lockable loading opening 50 which, in addition to a transporting container holder 52 which can be moved out on guides 51, serves for manually charging the storage with the transporting containers 46 is worked into the wall 49 located opposite wall 43 at an ergonomic height.

According to FIG. 11, a gripper 53 which is movable vertically and horizontally for transferring the transporting containers 46 is secured to a horizontal drive 55 by an extension arm 54. The horizontal drive 55 is in turn connected with an elevator 56.

In the cover region, the transporting containers 46 have a handle 57 to be grasped automatically by the gripper 53. Sufficient space is left above each transporting container 46 for the extension arm 54 to act with the gripper 53 for transferring.

After a transporting container 46 is grasped, it is transported horizontally from the storage shelf 45 into the open space 47 and is then transported vertically up to a plane which corresponds to the ergonomic height for manually charging the storage or to a plane for charging a platform of the loading and unloading device. When the plane is reached, the transporting container 46 is transferred to the platform or the transporting container holder 52 in the moved in position (FIG. 11 shows the transporting container holder 52 in the moved out position). Displacement in the opposite direction is effected in an analogous manner.

Figure 12:
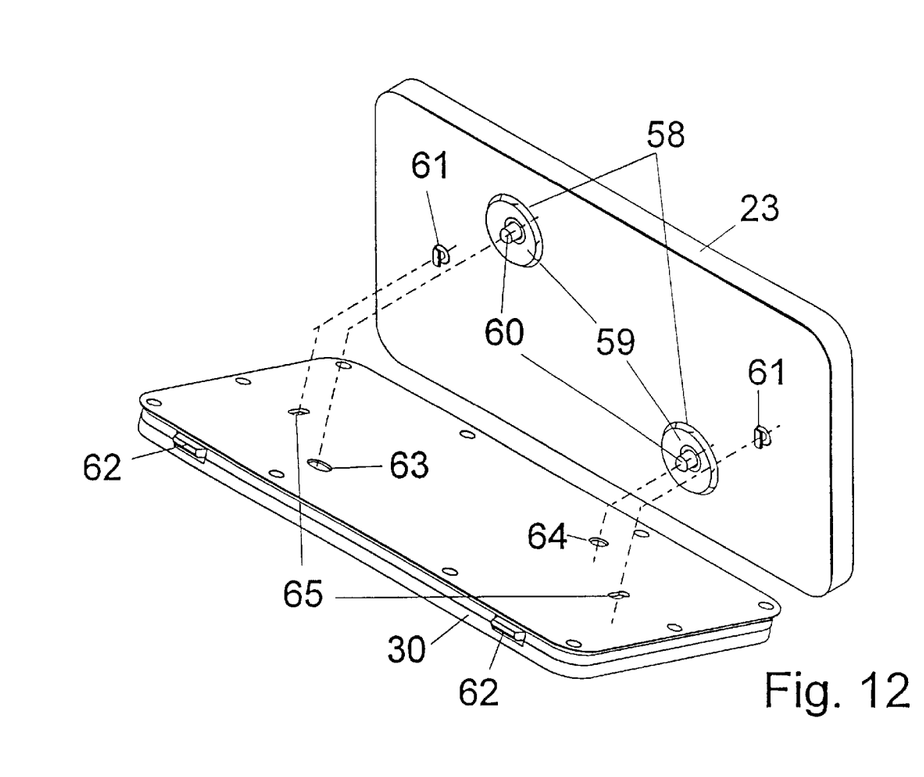
FIG. 12 shows a closure and a container cover.
Figure 13:
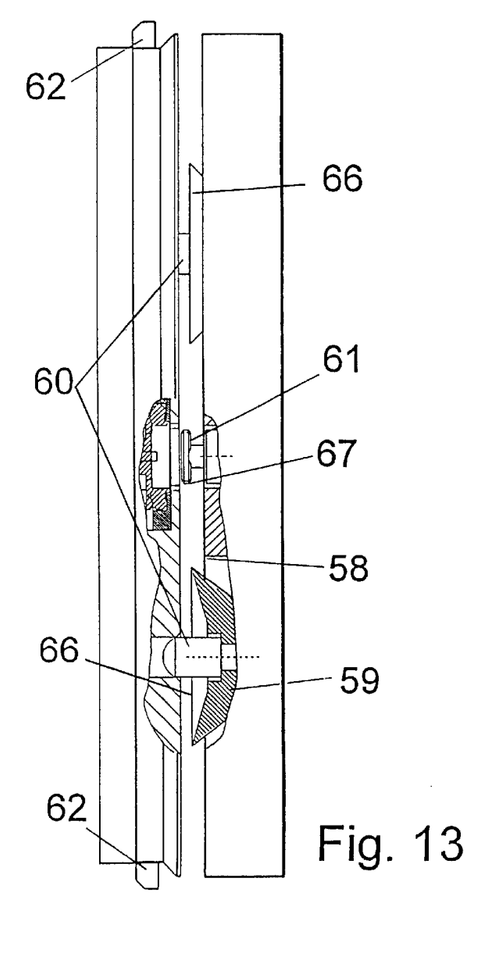
FIG. 13 shows the preorientated coupling of the closure and the container cover.

According to FIGS. 12 and 13, the closure 23 has suction elements 59 emerging from bore holes 58, aligning elements in the form of pins 60 being arranged in the center thereof. Further, keys 61 with a double-bit for actuating locking elements 62 in the container cover 30 are provided in the closure 23. An elongated hole 63 and a bore hole 64 which are adapted to the pins 60 are incorporated in the container cover 30, as are corresponding keyholes 65 for the keys 61. For the purpose of a preorientated alignment of the container cover 30 relative to the closure 23 during the coupling process, the pins 60 project beyond the suction elements 59 so that the latter first engage in the elongated hole 63 or in the bore hole 64. Subsequently, the keys 61 penetrate into the keyholes 65, the suction elements 59 resting on the surface of the container cover 30 by their projecting lips 66. During the suction process which now takes place, in which the lips 66 move back completely into the bore holes 58 which are constructed with a sufficiently large diameter, the surfaces of the closure 23 and container cover 30 are connected with one another in an adhering engagement and enclose adhering particles therebetween. By rotating the keys 61, a driver 67 provided in the interior of the container cover 30 is actuated and opens the locking elements 62. The closure 23 can be moved down into the semiconductor processing installation together with the container cover 30 so as to form a lock or transfer channel.

Apart from their opening function, the keys 61 exercise another advantageous effect. After the keys 61 which are inserted into the keyholes 65 are turned, the container cover 30 is also held, in the event of a failure of the vacuum in the suction elements, in that the double-bit engages behind the keyholes 65. The lips 66 of the suction elements 59 which expand again remain in tight contact with the surface of the container cover 30 so that both surfaces can be securely pressed together again immediately when the vacuum is restored. In order to prevent tensions during coupling, the aligning elements and the keys 61 are additionally held in a springing manner inside the closure 23 which is hollow inside.

Further advantageous steps for the coupling of the transporting container will be seen from FIGS. 14 to 17. On the one hand, the transporting container is deposited on the platform so as to be aligned. On the other hand, forces act on the transporting container during the opening process, as was explained, e.g., in the description referring to FIGS. 12 and 13, which forces must be compensated for in order to prevent disruption of the loading and unloading process.

Figure 14:
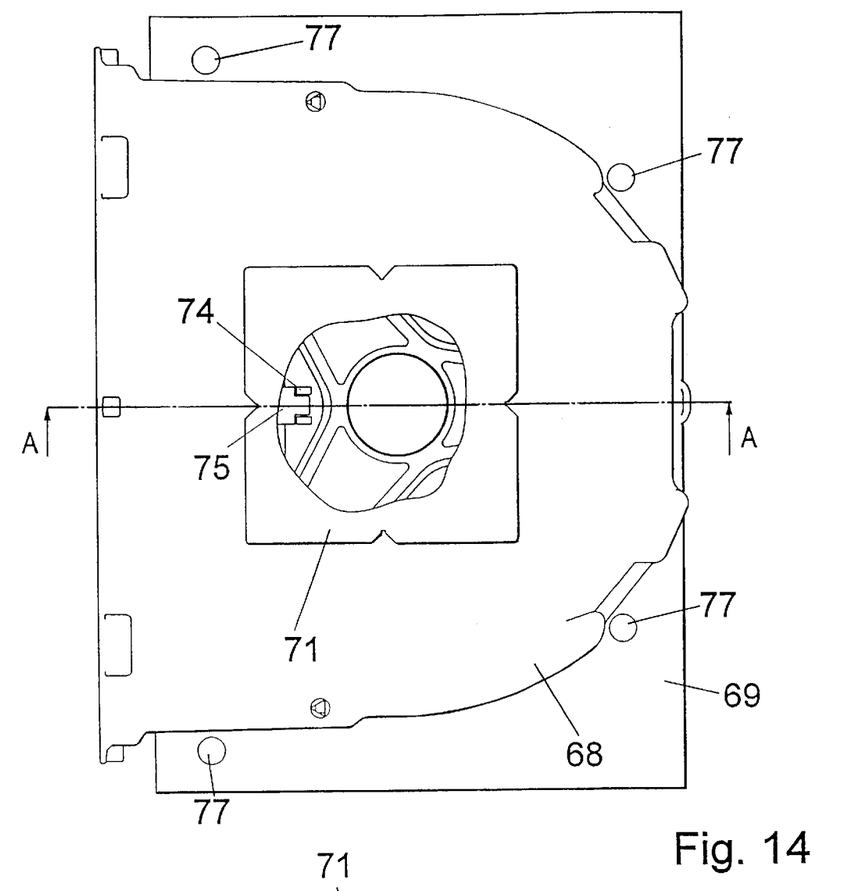
FIG. 14 shows a first variant of a clipped and partially cut-away transporting container.
Figure 15:
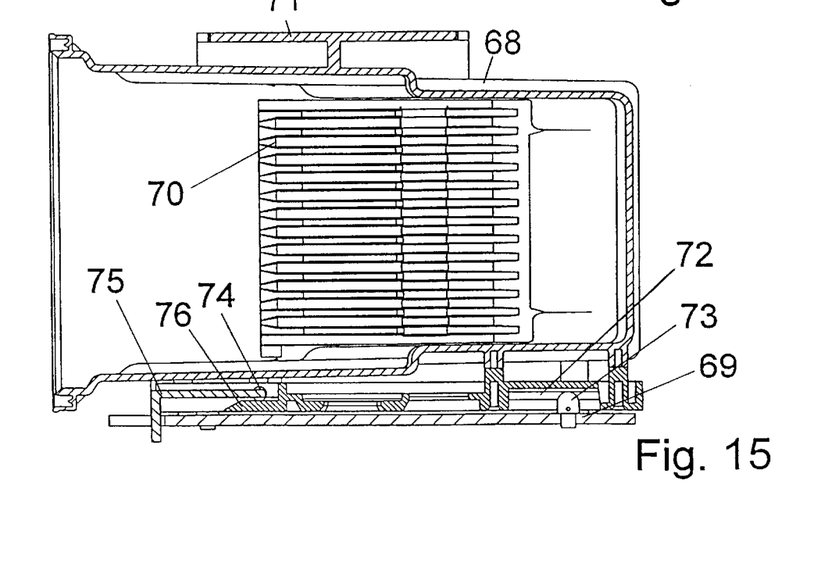
FIG. 15 shows a section A—A through the transporting container according to FIG. 14.

In FIGS. 14 and 15, a transporting container 68 is deposited on a platform 69 which corresponds in terms of function to the platforms shown in the Figures which were already described. The transporting container 68 has shelves 70 in its interior for holding disk-shaped objects. As was already mentioned with respect to the transporting container in FIG. 11, a handle, designated in this instance by 71, for an automatically operating gripper is arranged in the cover region. Aligning elements in the form of grooves 72 and engaging pins 73 which are adapted to one another for the purpose of orientated placement are provided in a three-point formation in the base of the transporting container 68 and in the platform 69. During the horizontal coupling movement of the transporting container 68, a springing roller 74 slides at a contact pressure arm 75, which is stationary relative to the platform 69, along a beveled crosspiece 76, which is secured at the base at a distance therefrom, and fixes the transporting container 68. Visual orientation pegs 77 may be helpful if the transporting container 6 is to be placed on the platform 69 manually.

Figure 16:
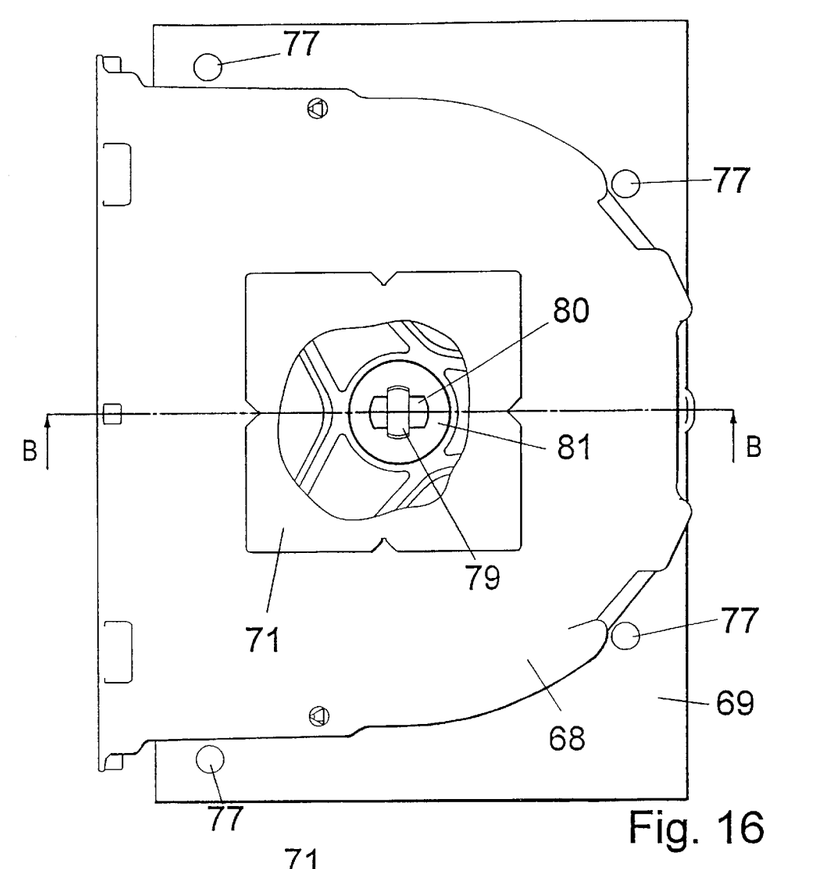
FIG. 16 shows a second variant of a clipped and partially cut-away transporting container.
Figure 17:
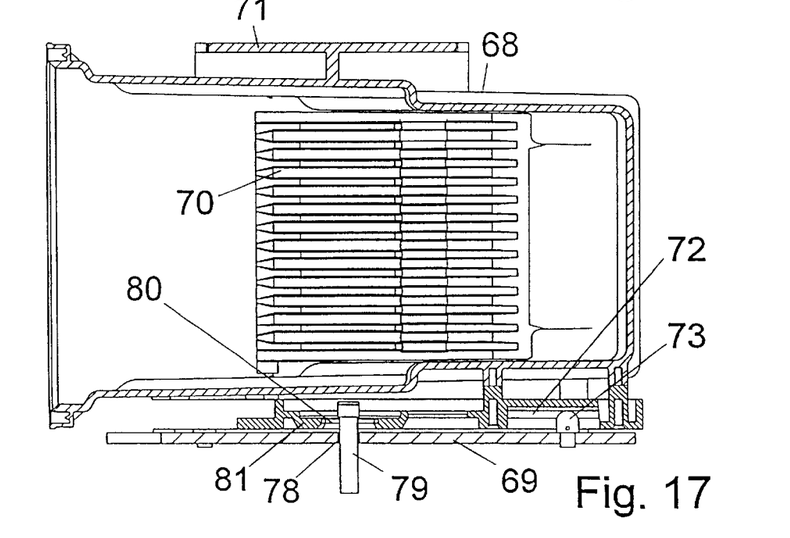
FIG. 17 shows a section B—B through the transporting container according to FIG. 16.

Another way of securing a transporting container on the platform is provided by a solution according to FIGS. 16 and 17. A key 79 which is guided through a bore hole 78 in the platform 69 penetrates through a keyhole 80 during the placement of the transporting container 68, this keyhole 80 being worked into a plate 81 which is fastened at the base at a distance therefrom, and engages behind the plate 81 after a closing movement.

Figures 18, 19:
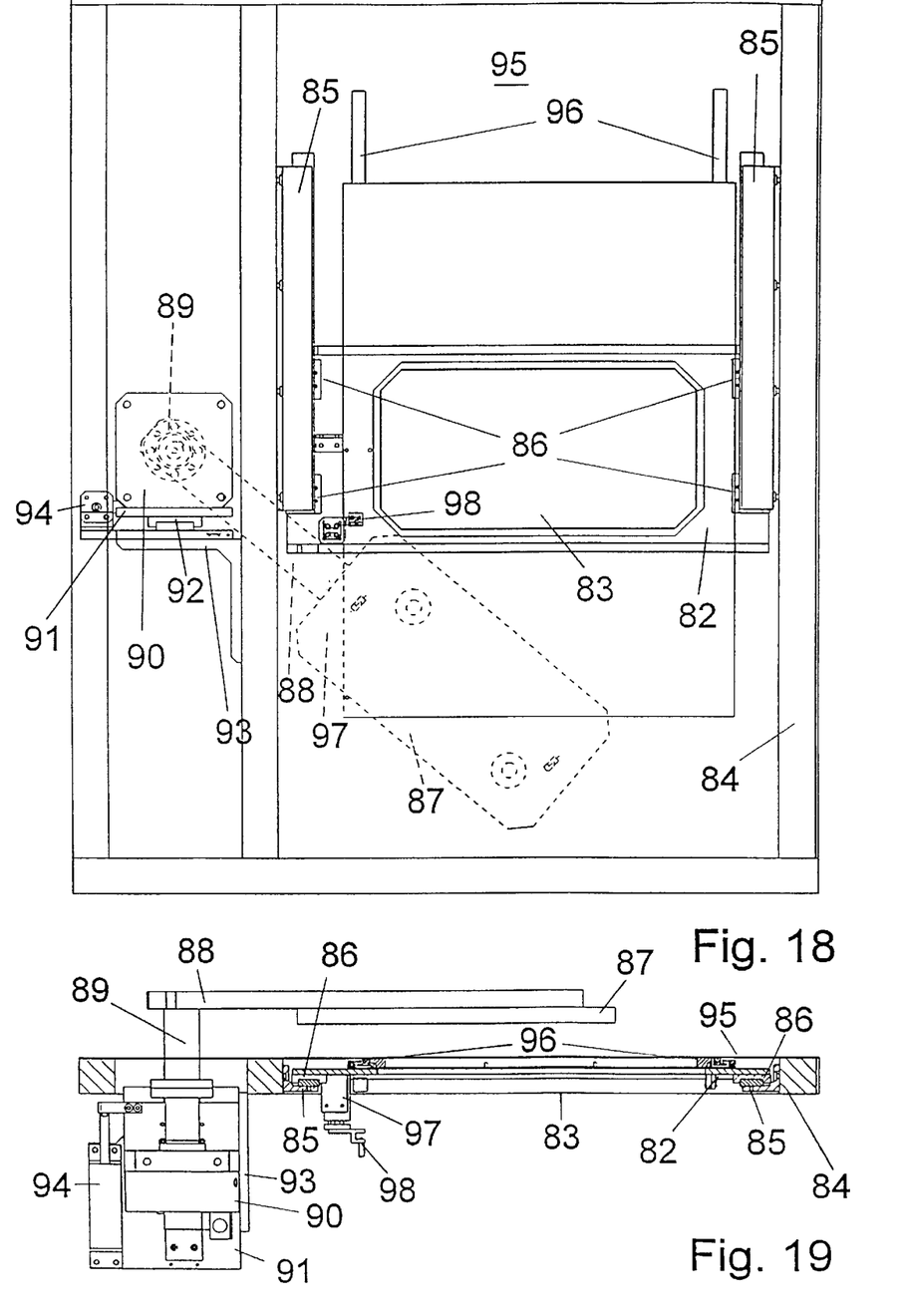
FIG. 18 shows a front view of a portion of a loading and unloading station with a second device for opening and closing a closure.
FIG. 19 shows a top view of the device according to FIG. 18.

Another device for opening and closing a closure is described with reference to FIGS. 18 and 19, by means of which device the loading and unloading device can be decreased in depth. As in FIGS. 1 to 3, this embodiment example employs a shield, the charging opening being worked into this shield. However, it is also possible to use a stationary charging opening in combination with this device. Although the charging opening is open, a coupled transporting container deposited on a platform is not shown for the sake of simplicity.

The shield with the charging opening, designated in this instance by 82 and 83, is supported by a frame 84 via guides 85 and guide slides 86. A closure 87 for the charging opening 83 is fastened, via an arm 88, to a rotor axle 89 which is driven by a rotary drive 90. The rotary drive 90 is screwed to a holding plate 91 which is displaceable in the loading and unloading direction by means of a horizontal guide 92 on a support plate 93 which is connected with the frame 84 in a stationary manner. The displacement is effected by means of a suitable drive 94, e.g., a pneumatic drive.

The shield 82 is advantageously designed so as to be reinforced in the region of the charging opening 83 and covers an opening in a wall 95 to which the frame 84 is fastened. The opening, which is not visible, is dimensioned vertically so as to allow a vertical adjustment of the charging opening 83 along the entire opening height. Accordingly, a manipulating device which is arranged in a stationary manner can achieve access through the charging opening in different indexed planes of a coupled transporting container.

A labyrinth seal 96 performs a sealing function during the adjustment of the shield 82, one portion of the labyrinth seal 96 being secured so as to adjoin the opening in the wall 95 while the other portion is secured at the adjustable shield 82.

A driver 98 for the platform, which driver 98 can be actuated by a pneumatic cylinder 97, is fastened at the shield 82 for the purpose of coupling the transporting container. After the platform has been moved along with the transporting container into the coupling region, it is grasped by the driver 98. By means of the lift of the pneumatic cylinder 97, the transporting container, which is fixed on the platform, is pressed, with its container cover, against the closure 87 which is still in the closing state. The closure 87 and the container cover are connected with one another in an adhering engagement, as has already been described, and the locking elements in the container cover are opened.

When actuated by the drive 94, the support plate 93 is displaced together with the elements fastened thereto so that the closure 87, together with the container cover, is removed from the charging opening 83. The closure 83 is driven by the motor 90 so as to rotate into a position in which the charging opening is free for loading and unloading the disk-shaped objects. This position corresponds to that shown in FIG. 18.

While the foregoing description and drawings represent the preferred embodiments of the present invention, it will be obvious to those skilled in the art that various changes and modifications may be made therein without departing from the true spirit and scope of the present invention.

What is claimed is:

1. A loading and unloading station for semiconductor processing installations having a charging opening through which disk-shaped objects can be loaded, unloaded and reloaded comprising:

a removable closure for said charging opening;

a transporting container for accommodating said disk-shaped objects from which said objects can be loaded, unloaded and reloaded;

a container cover which is provided with said transporting container;

means for coupling said container cover of said transporting container with said closure;

means for effecting a simultaneous opening of said charging opening and transporting container by jointly moving said container cover and closure into a semiconductor processing installation; and a horizontally adjustable first platform for supporting the transportable container, said platform being provided with means for aligning and securing the transporting container for the purpose of coupling the container cover with the closure;

wherein an outer surface of said cover includes at least a pair of pin holes, and at least a pair of key holes;

an outer surface of said closure includes at least a pair of pins, and at least a pair of keys;

said cover includes locking elements;

said cover is engaged with closure by aligning said pin holes with said pins and aligning said key holes with said keys; and said locking elements of said cover are actuated by rotating said keys on said closure.

2. A loading and unloading station for semiconductor processing installations having a charging opening through which disk-shaped objects can be loaded, unloaded and reloaded comprising:

a removable closure for said charging opening;

a transporting container for accommodating said disk-shaped objects from which said objects can be loaded, unloaded and reloaded;

a container cover which is provided with said transporting container;

means for coupling said container cover of said transporting container with said closure by adhering engagement;

means for effecting a simultaneous opening of said charging opening and transporting container by jointly moving said container cover and closure into a semiconductor processing installation;

manipulating device being arranged in said semiconductor processing installation for carrying out the loading and unloading of the disk-shaped objects through the charging opening and into said transporting container; and a horizontally adjustable first platform for supporting the transportable container, said platform being provided with means for aligning and securing the transporting container for the purpose of coupling the container cover with the closure;

wherein an outer surface of said cover includes at least a pair of pin holes, and at least a pair of key holes;

an outer surface of said closure includes at least a pair of pins, and at least a pair of keys;

said cover includes locking elements;

said cover is engaged with closure by aligning said pin holes with said pins and aligning said key holes with said keys; and said locking elements of said cover are actuated by rotating said keys on said closure.

* * * * *